United States Patent [19]

Schluter

[11] Patent Number: 5,443,312
[45] Date of Patent: Aug. 22, 1995

[54] RACK ASSEMBLY FOR FACILITATING ACCESS TO WALL AND CABINET-MOUNTED SERVICEABLE EQUIPMENT

[76] Inventor: Robert J. Schluter, 3 Pine Hill Rd., Kinnelon, N.J. 07405

[21] Appl. No.: 224,282

[22] Filed: Apr. 7, 1994

[51] Int. Cl.⁶ .............................................. A47B 88/00
[52] U.S. Cl. ........................... 312/334.27; 312/201; 312/223.1; 312/223.6; 312/242; 312/246; 312/249.9
[58] Field of Search .................. 312/201, 223.1, 223.6, 312/242, 246, 249.9, 334.27; 248/430

[56] References Cited

U.S. PATENT DOCUMENTS

| | | | |
|---|---|---|---|
| 2,166,704 | 7/1939 | Faulkes | 312/201 X |
| 2,336,433 | 12/1943 | Woina | 248/430 X |
| 3,165,368 | 1/1965 | Hughes et al. | 312/242 |
| 3,205,032 | 9/1965 | Leigh . | |
| 3,309,022 | 5/1967 | Ingold | 312/201 X |
| 3,801,176 | 4/1974 | Higbee | 312/201 X |
| 4,084,125 | 4/1978 | King | 312/249.9 X |
| 4,094,256 | 6/1978 | Holper et al. . | |
| 4,103,633 | 8/1978 | Frank et al. . | |
| 4,123,126 | 10/1978 | Querengasser | 312/201 |
| 4,217,853 | 8/1980 | Davitz . | |
| 4,260,208 | 4/1981 | Lun Ho et al. . | |
| 4,296,981 | 10/1981 | Hildebrandt et al. | 312/223.6 X |
| 4,592,602 | 6/1986 | Kuster et al. . | |
| 4,597,615 | 7/1986 | Steger | 312/201 |
| 4,616,888 | 10/1986 | Peterman | 312/201 |
| 4,702,535 | 10/1987 | Beun | 312/223.1 X |
| 4,792,881 | 12/1988 | Wilson et al. . | |
| 4,911,507 | 3/1990 | Leist | 312/201 |
| 5,160,189 | 11/1992 | Johnston et al. | 312/201 |
| 5,205,627 | 4/1993 | Davison et al. | 312/201 |
| 5,328,260 | 7/1994 | Beirise | 312/223.6 |

FOREIGN PATENT DOCUMENTS

| | | | |
|---|---|---|---|
| 169955 | 2/1986 | France | 312/223.6 |
| 5130918 | 5/1993 | Japan | 312/249.9 |
| 5317127 | 12/1993 | Japan | 312/249.9 |

*Primary Examiner*—Jose V. Chen
*Assistant Examiner*—Rodney B. White
*Attorney, Agent, or Firm*—Klauber & Jackson

[57] ABSTRACT

A rack assembly 10 that securely accommodates a stack of assorted electronic or modular units therein, such that the entire rack assembly, including the stacked units, is extensible along a detachable service stand so as to allow unrestricted service access to the stacked units. Such a rack assembly comprises a frame assembly, a base assembly, and a detachable service stand assembly.

20 Claims, 5 Drawing Sheets

RACK ASSEMBLY FOR FACILITATING ACCESS TO WALL AND CABINET-MOUNTED SERVICEABLE EQUIPMENT

BACKGROUND OF THE INVENTION

1. Field of the Invention

The present invention relates to rack systems that are designed to accommodate a stack of assorted electronic units and the like and, more particularly, to a rack assembly that is designed to allow service access to a stack of assorted electronic or modular units accommodated therein.

2. Description of the Prior Art

Rack systems for accommodating electronic units and the like in a stacked arrangement are generally known in the art. Such rack systems are typically of cabinet-like construction so as to allow for the vertical stacking of the accommodated units. Most of these rack systems provide access to both the front control panels and the rear input/output (I/O) interface panels of the stacked units. However, such access is typically only provided through openings created in the front and rear walls of the rack systems, respectively. Thus, in order to service one of the stacked units, which typically requires access to both the front control panels and the rear I/O interface panels, technicians repeatedly have to travel between the front and rear walls of the rack systems. Indeed, several technicians are often required to service one of the stacked units since simultaneous access to both the front control panels and the rear I/O interface panels is regularly required. Such is time-consuming and costly due to increased labor costs. Furthermore, similar circumstances develop when installing and removing units into and from, respectively, the rack systems.

Several patents are directed toward the above-described rack systems, or rack systems in general. For example, U.S. Pat. Nos. 4,592,602 by Kuster et al., 3,205,032 by Leigh, 4,260,208 by Lun Ho et al., 4,103,633 by Frank et al., 4,792,881 by Wilson et al., and 4,094,256 by Holper et al. are all generally related to rack systems. A brief description of these patents will now be given.

In U.S. Pat. No. 4,592,602, Kuster et al. discloses a modular mounting rack for electronic equipment that provides a junction or interface between internal and external electrical wiring. The mounting rack is also equipped with slide rails or extensible drawer-type rails for supporting and/or extending the individual electronic units from within the mounting rack.

In U.S. Pat. No. 3,205,032, Leigh discloses a retractable and extensible storage unit for an electrical appliance that includes its own outlet for receiving a plug from the contained appliance. The storage unit is also equipped with pairs of parallel links that allow the storage unit to be swingably adjusted into either a retractable or extensible position.

In U.S. Pat. No. 4,260,208, Lun Ho et al. discloses a cabinet having a pair of rail members mounted internal thereto that allow a support frame, which supports electronic equipment, to slide thereon for the purpose of allowing the electronic equipment to be moved internal and external to the cabinet.

In U.S. Pat. No. 4,103,633, Frank et al. discloses a cabinet that includes a folding support having tracks that allow an apparatus contained therein to be moved thereon. The folding support is hingedly attached to the cabinet.

In U.S. Pat. No. 4,792,881, Wilson et al. discloses a work surface that includes a wiring system for receiving plugs of supported electrical equipment.

Similarly, in U.S. Pat. No. 4,094,256, Holper et al. discloses a work surface that includes a wiring system for receiving plugs of supported electrical equipment.

Although all of the above-discussed patents are related rack systems, none are directed toward a rack assembly that securely accommodates therein a stack of assorted electronic or modular units, such that an entire frame assembly, including the stacked units, is extensible along a detachable service stand so as to allow unrestricted service access to the stacked units. The present invention is directed to such a rack assembly.

SUMMARY OF THE INVENTION

The present invention contemplates a rack assembly that securely accommodates therein a stack of assorted electronic or modular units, such that an entire frame assembly, including the stacked units, is extensible along a detachable service stand so as to allow unrestricted service access to the stacked units. Such a rack assembly comprises a frame assembly, a base assembly, and a detachable service stand assembly. The frame assembly comprises horizontal base plates, vertical rack rails, and frame assembly transport means. The base assembly comprises a base pan and base assembly guide means for cooperatively engaging with and guiding the frame assembly transport means, and hence the frame assembly. The detachable service stand assembly comprises a detachable service stand with support legs and service stand assembly guide means for cooperatively engaging with and guiding the frame assembly transport means, and hence the frame assembly. The rack assembly further comprises at least one hinged cable carrier disposed between the frame assembly and the base assembly.

The rack assembly is functional in that the frame assembly may securely accommodate therein a stack of assorted electronic or modular units, and, by virtue of the frame assembly transport means, the frame assembly, including the stacked units, is movable along the guide means of both the base assembly and the detachable service stand assembly. When the frame assembly is moved onto the detachable service stand of the detachable service stand assembly, unrestricted service access is provided to the stacked units. When the frame assembly is moved onto the base pan of the base assembly, the service stand assembly may be detached. Each cable carrier provides management and support for cables associated with the stacked units while the frame assembly is moved along the guide means of both the base assembly and the detachable service stand assembly.

The present invention rack assembly differs from the modular mounting rack disclosed in the Kuster et al. patent in that Kuster et al. discloses that the individual electronic units may only be extended from the modular mounting rack along the extensible drawer-type rails, whereas in the present invention rack assembly the entire frame assembly, including the stacked units, is extensible. Furthermore, the present invention rack assembly provides a detachable service stand along which the frame assembly may be extended, which is not disclosed in the Kuster et al. patent. Accordingly, the present invention rack assembly is distinguishable from the modular mounting rack disclosed in the Kuster et al. patent.

The present invention rack assembly differs from the storage unit disclosed in the Leigh patent in that Leigh discloses that the storage unit may only be swingably adjusted into the retractable and extensible positions, whereas in the present invention rack assembly the frame assembly may be extended from a base position along guide means by transport means. Furthermore, the present invention rack assembly provides a detachable service stand along which the frame assembly may be extended, which is not disclosed in the Leigh patent. Accordingly, the present invention rack assembly is distinguishable from the storage unit disclosed in the Leigh patent.

The present invention rack assembly differs from the cabinet disclosed in the Lun Ho et al. patent in that Lun Ho et al. discloses that the electronic units may only be extended from the cabinet along the internally mounted rail members, whereas in the present invention rack assembly the entire frame assembly, including the electronic equipment, is extensible along a detachable service stand. Accordingly, the present invention rack assembly is distinguishable from the cabinet disclosed in the Lun Ho et al. patent.

The present invention rack assembly differs from the cabinet disclosed in the Frank et al. patent in that Frank et al. discloses that the folding support is permanently, hingedly attached to the cabinet, whereas in the present invention rack assembly a detachable service stand is provided which can be detached and used by other rack assemblies. Furthermore, the present invention rack assembly allows operation of the electronic equipment while the frame assembly is in either the extended or base positions, whereas the apparatus associated with the cabinet disclosed in the Frank et al. patent may only be operated when in the extended position. Accordingly, the present invention rack assembly is distinguishable from the cabinet disclosed in the Frank et al. patent.

The present invention rack assembly differs from the work surfaces disclosed in the Wilson et al. and Holper et al. patents in that the work surfaces disclosed in Wilson et al. and Holper et al. do not allow electronic equipment, or equipment of any kind, to be moved for installation and/or service, whereas the present invention does. Accordingly, the present invention rack assembly is clearly distinguishable from the work surfaces disclosed in the Wilson et al. and Holper et al. patents.

From the above descriptive summary it is apparent how the present invention rack assembly is distinguishable from the above-mentioned prior art.

Accordingly, the primary objective of the present invention is to provide a rack assembly that securely accommodates therein a stack of assorted electronic or modular units, such that the entire rack assembly, including the stacked units, is extensible along a detachable service stand so as to allow unrestricted service access to the stacked units.

Other objectives and advantages of the present invention will become apparent to those skilled in the art upon reading the following detailed description and claims, in conjunction with the accompanying drawings which are appended hereto.

BRIEF DESCRIPTION OF THE DRAWINGS

In order to facilitate a fuller understanding of the present invention, reference is now be made to the appended drawings. The drawings should not be construed as limiting the present invention, but are intended to be exemplary only.

PREFERRED EMBODIMENT OF THE PRESENT INVENTION

Figure 1:
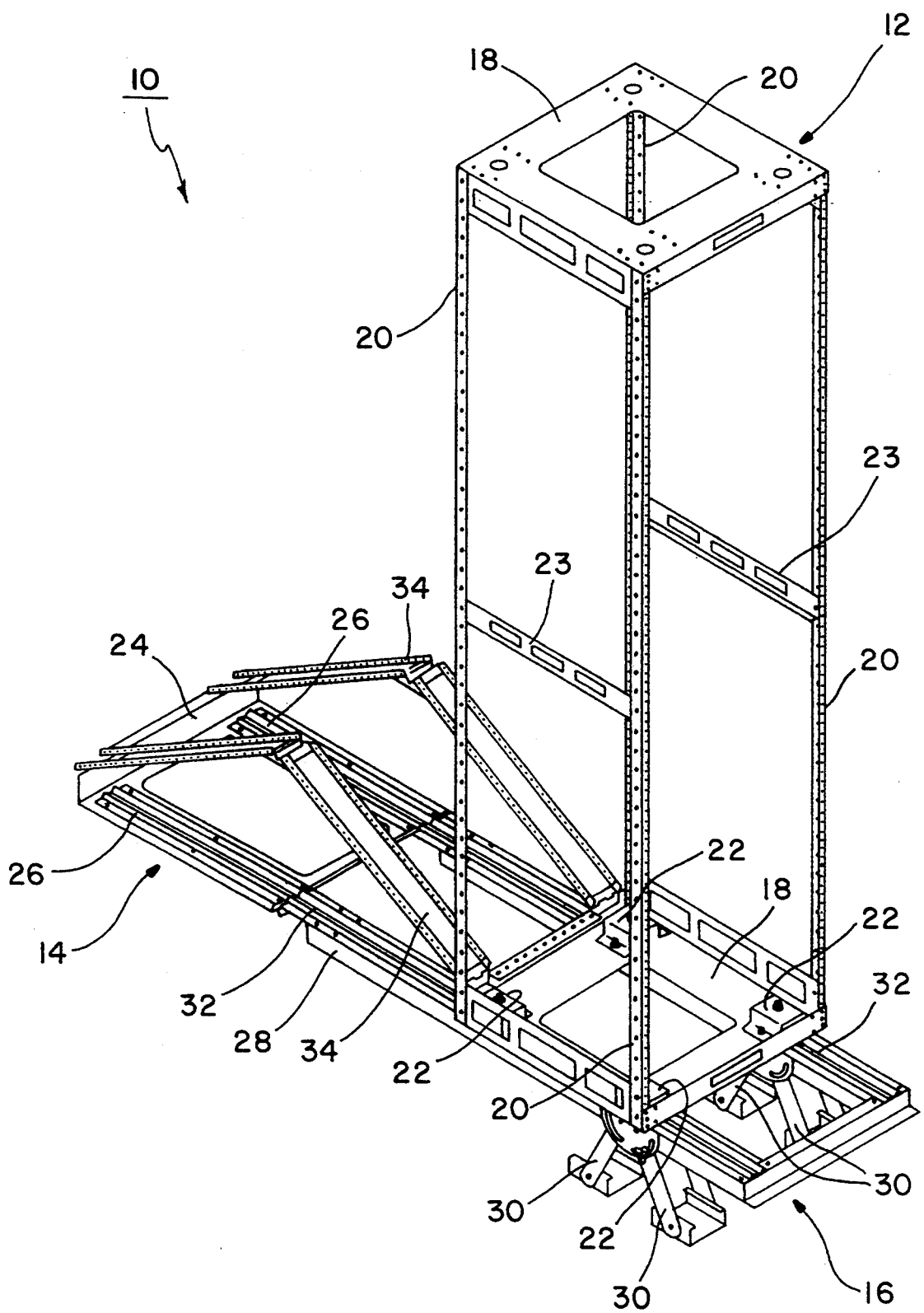
FIG. 1 is a perspective view of a rack assembly according to the present invention for securely accommodating therein a stack of assorted electronic or modular units.

Referring to FIG. 1, there is shown a perspective view of a rack assembly 10 according to the present invention for securely accommodating therein a stack of assorted electronic or modular units. The rack assembly 10 comprises a frame assembly 12, a base assembly 14, and a detachable service stand assembly 16. The frame assembly 12 comprises horizontal base plates 18, vertical rack rails 20, and frame assembly transport means 22. The frame assembly 12 also comprises an optional pair of horizontal braces 23. The base assembly 14 comprises a base pan 24 and base assembly guide means 26 for cooperatively engaging with and guiding the frame assembly transport means 22, and hence the frame assembly 12. The detachable service stand assembly 16 comprises a detachable service stand 28 with support legs 30 and service stand assembly guide means 32 for cooperatively engaging with and guiding the frame assembly transport means 22, and hence the frame assembly 12. The rack assembly 10 further comprises at least one hinged cable carrier 34 disposed between the frame assembly 12 and the base assembly 14.

The rack assembly 10 is functional in that the frame assembly 12 may securely accommodate therein a stack of assorted electronic or modular units (not shown), and, by virtue of the frame assembly transport means 22, the frame assembly 12, including the stacked units, is movable along the guide means 26,32 of both the base assembly 14 and the detachable service stand assembly 16, respectively. When the frame assembly 12 is moved onto the detachable service stand 28 of the detachable service stand assembly 16, unrestricted service access is provided to the stacked units. When the frame assembly 12 is moved onto the base pan 24 of the base assembly 14, the service stand assembly 16 may be detached. Each cable carrier 34 provides management and support for cables (see FIG. 3) associated with the stacked units while the frame assembly 12 is moved along the guide means 26,32 of both the base assembly 14 and the detachable service stand assembly 16, respectively.

At this point it should be noted that four adjustable support legs 30 are provided so as to be adaptable to the height of the base assembly 14 and to level the detachable service stand assembly 16 when attached to the base assembly 14, as shown.

Figure 2:
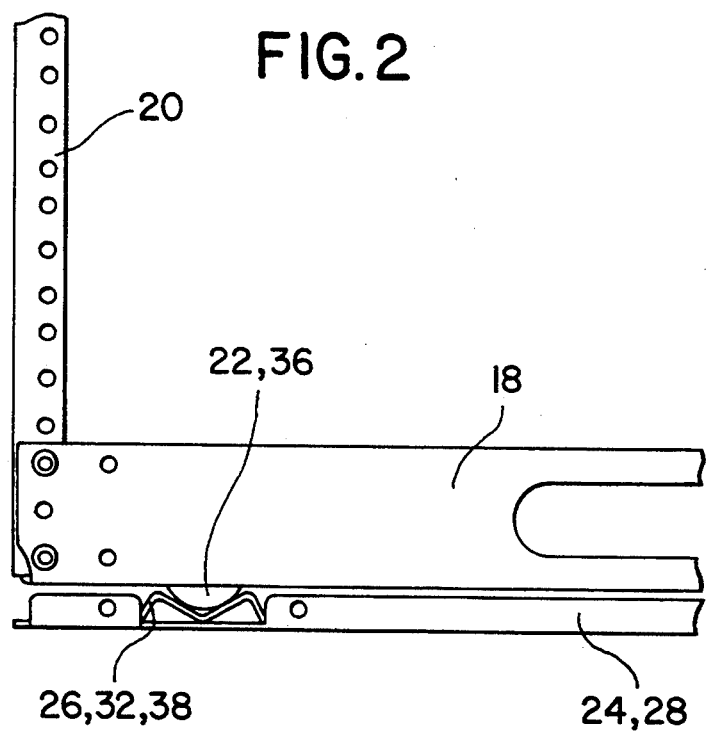
FIG. 2 is a cutaway view of the present invention rack assembly shown in FIG. 1 detailing the frame assembly transport means and the guide means of either the base assembly or the detachable service stand assembly.

Referring to FIG. 2, there is shown a cutaway view of the present invention rack assembly 10 shown in FIG. 1 detailing the frame assembly transport means 22 and the guide means 26,32 of either the base assembly 14 or the detachable service stand assembly 16. The frame assembly transport means 22 comprises ball bearing casters 36. The guide means 26,32 of both the base assembly 14 and the detachable service stand assembly 16 comprises a caster track fixture 38. The caster track fixtures 38 of both the base assembly 14 and the detachable service stand assembly 16 cooperatively engage with and guide the ball bearing casters 36 of the frame assembly 12 such that the frame assembly 12 is movable on both the base assembly 14 and the detachable service stand assembly 16, respectively.

Referring simultaneously to FIGS. 1 and 2, when the detachable service stand assembly 16 is attached to the base assembly 14, as shown, the caster track fixtures 38 of both the base assembly 14 and the detachable service stand assembly 16 provide a continuous guide system for cooperatively engaging with and guiding the ball bearing casters 36 of the frame assembly 12. Thus, the frame assembly 12 is movable between the base assembly 14 and the detachable service stand assembly 16 when the detachable service stand assembly 16 is attached to the base assembly 14, as shown. When the frame assembly 12 is moved onto the detachable service stand 28 of the detachable service stand assembly 16, unrestricted service access is provided to the stacked units. When the frame assembly 12 is moved onto the base pan 24 of the base assembly 14, the service stand assembly 16 may be detached. It should be noted that the detachable service stand assembly 16 may be attached to the base assembly 14 via a number of common attachment means such as screws, bolts, and/or mating tabs or flaps.

Figure 3:
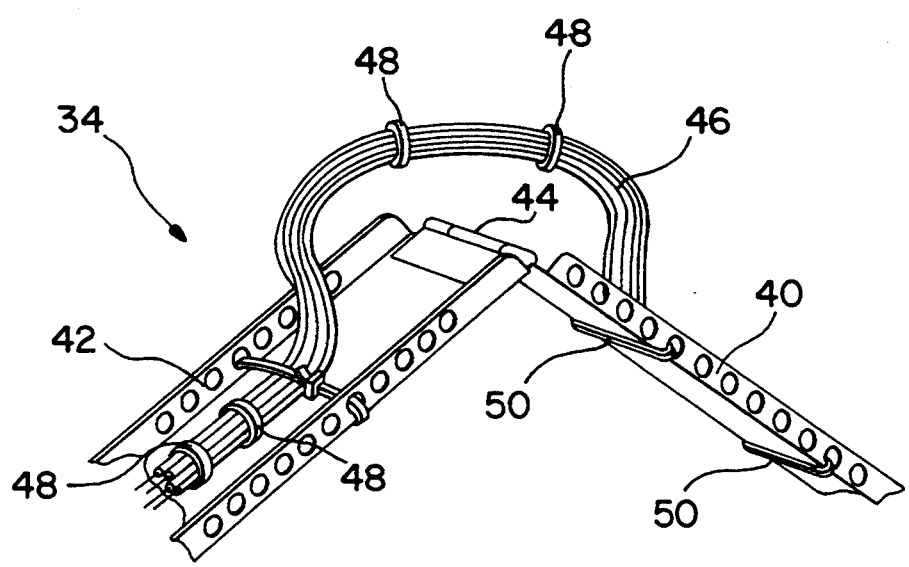
FIG. 3 is a cutaway view of the present invention rack assembly shown in FIG. 1 detailing one of the hinged cable carriers disposed between the frame assembly and the base assembly.

Referring to FIG. 3, there is shown a cutaway view of the present invention rack assembly 10 shown in FIG. 1 detailing one of the hinged cable carriers 34 disposed between the frame assembly 12 and the base assembly 14. The hinged cable carrier 34 comprises a first tray 40 and a second tray 42 each attached at a first end to a hinge 44. The first tray 40 is attached at a second end to the frame assembly 12, and the second tray 42 is attached at a second end to the base assembly 14. Cables 46 from the stacked units may be bundled with bundle wraps 48 and tied down with tie wraps 50 so as to be managed and supported by the hinged cable carrier 34. The hinge 44 is situated so as to simultaneously provide management and support for the cables 46 while allowing for the movement of the frame assembly 12 between the base assembly 14 and the detachable service stand assembly 16 when the detachable service stand assembly 16 is attached to the base assembly 14. It should be noted that the first tray 40 and the second tray 42 may be attached to the hinge 44, the frame assembly 12, and the base assembly 14, respectively, via a number of common attachment means such as screws, bolts, and/or rivets.

Figure 4:
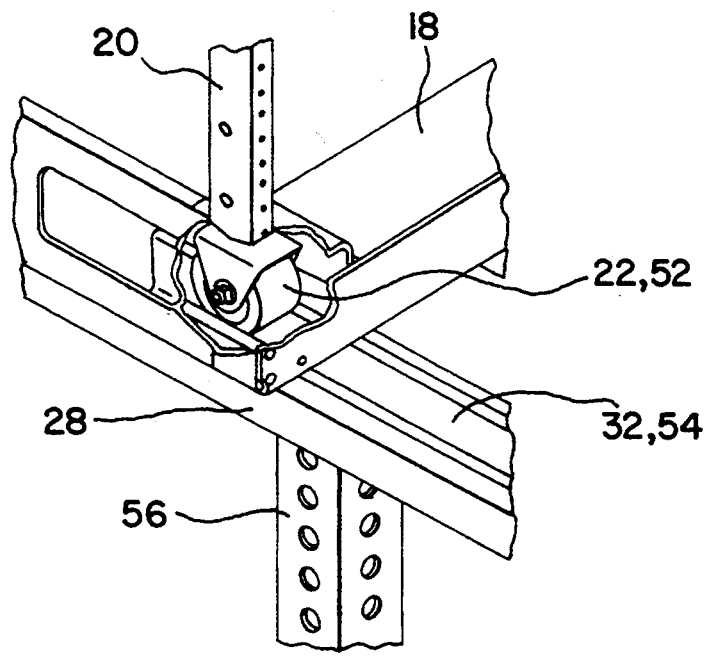
FIG. 4 is a cutaway view of an alternate embodiment of the present invention rack assembly detailing a second embodiment of the frame assembly transport means and the service stand assembly guide means.

Referring to FIG. 4, there is shown a cutaway view of an alternate embodiment of the present invention rack assembly detailing a second embodiment of the frame assembly transport means 22 and the service stand assembly guide means 32. Common with the rack assembly 10 shown in FIG. 1, this alternate embodiment comprises horizontal base plates 18, vertical rack rails 20, and a detachable service stand 28. The frame assembly transport means 22 comprises flat rollers 52. The service stand assembly guide means 32 comprises a channel 54. At this point it should be noted that base assembly guide means 26 associated with this alternate embodiment also comprises a channel 54. Accordingly, the channels 54 of both the base assembly 14 and the detachable service stand assembly 16 cooperatively engage with and guide the flat rollers 52 of the frame assembly 12 such that the frame assembly 12 is movable on both the base assembly 14 and the detachable service stand assembly 16, respectively.

At this point it should be noted that a fixed-length support leg 56 is shown having a length corresponding to the height of the base assembly 14.

Figure 5:
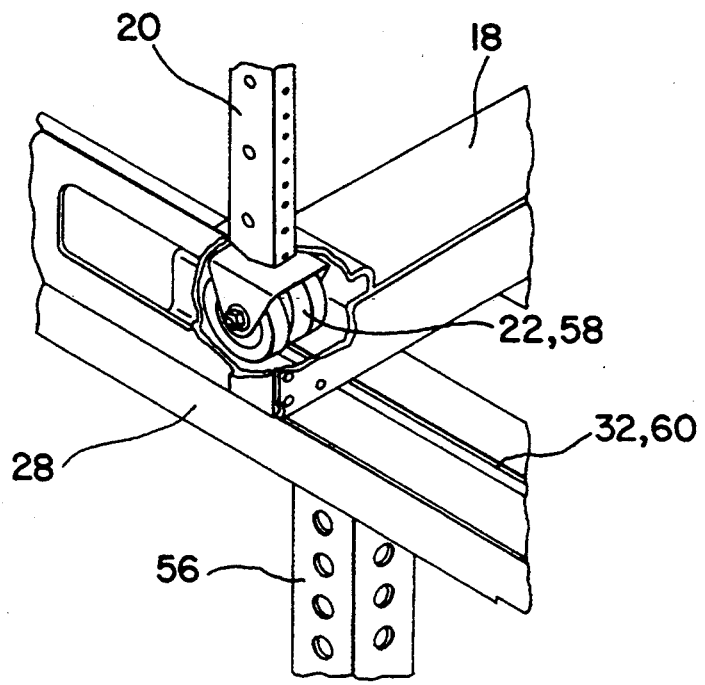
FIG. 5 is a cutaway view of an alternate embodiment of the present invention rack assembly detailing a third embodiment of the frame assembly transport means and the service stand assembly guide means.

Referring to FIG. 5, there is shown a cutaway view of an alternate embodiment of the present invention rack assembly detailing a third embodiment of the frame assembly transport means 22 and the service stand assembly guide means 32. Common with the rack assembly 10 shown in FIG. 1, this alternate embodiment comprises horizontal base plates 18, vertical rack rails 20, and a detachable service stand 28. The frame assembly transport means 22 comprises notched wheels 58. The service stand assembly guide means 32 comprises a guide rail 60. At this point it should be noted that base assembly guide means 26 associated with this alternate embodiment also comprises a guide rail 60. Accordingly, the guide rails 60 of both the base assembly 14 and the detachable service stand assembly 16 cooperatively engage with and guide the notched wheels 58 of the frame assembly 12 such that the frame assembly 12 is movable on both the base assembly 14 and the detachable service stand assembly 16, respectively.

Figure 6:
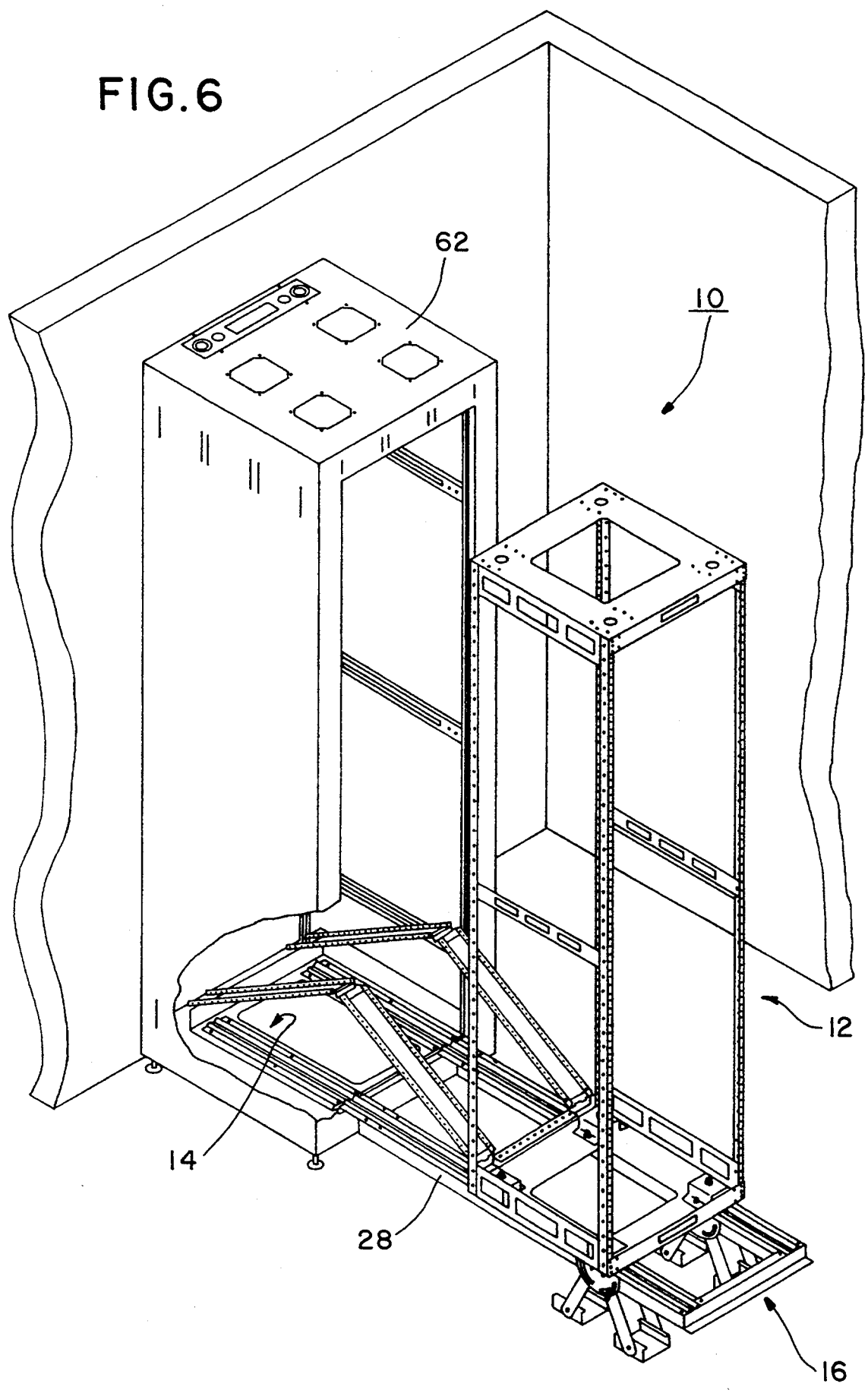
FIG. 6 is a perspective view of the present invention rack assembly shown in FIG. 1 mounted in a cabinet.

Referring to FIG. 6, there is shown a perspective view of the present invention rack assembly 10 shown in FIG. 1 mounted in a cabinet 62. The rack assembly 10 is mounted in the cabinet 62 by securely attaching the base assembly 14 to the cabinet 62. From this view it can be readily seen how that when the frame assembly 12 is moved onto the detachable service stand 28 of the detachable service stand assembly 16, unrestricted service access is provided to the stacked units. It should be noted that the base assembly 14 may be attached to the cabinet 62 via a number of common attachment means such as screws, bolts, and/or rivets.

Figure 7:
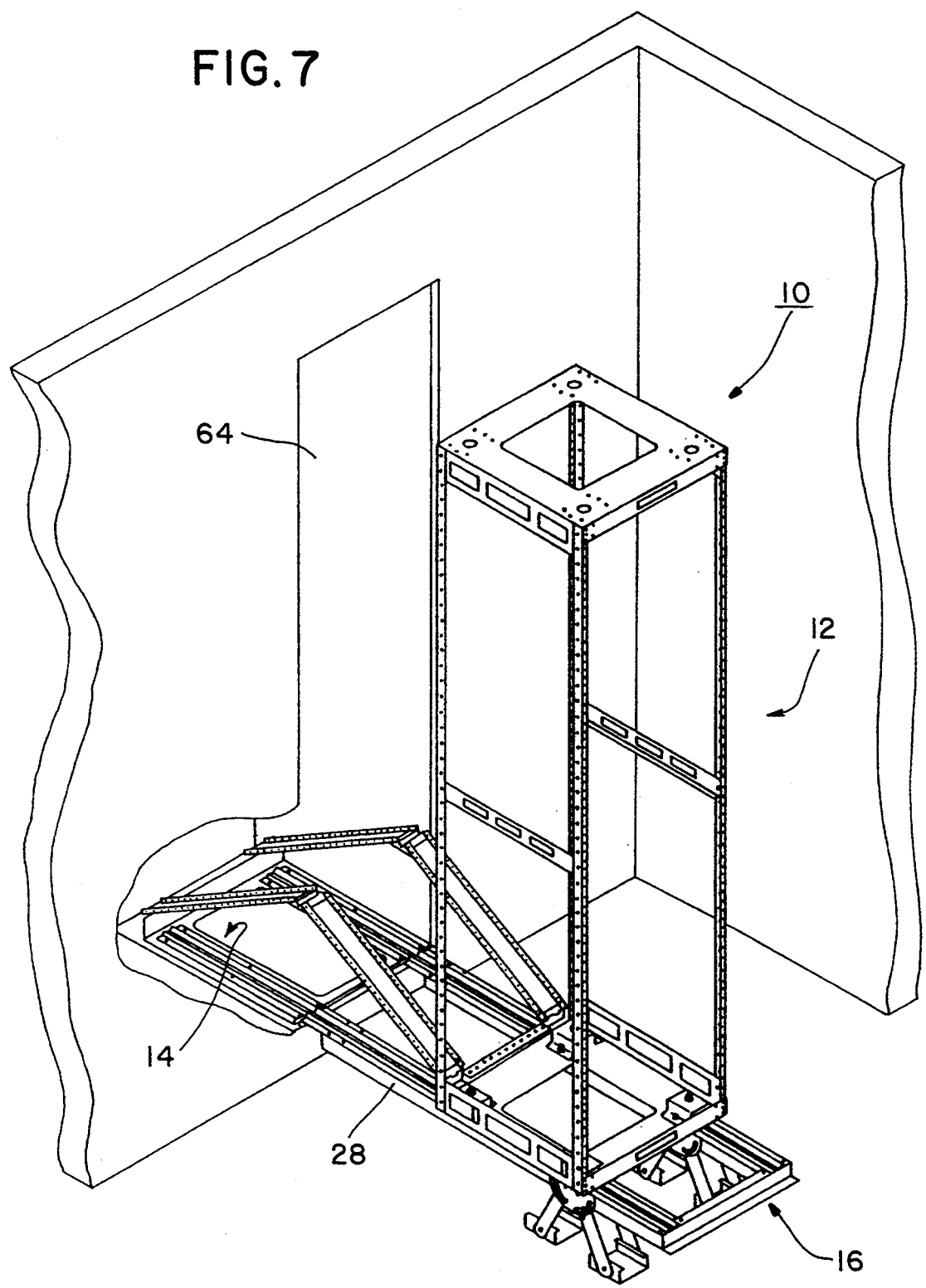
FIG. 7 is a perspective view of the present invention rack assembly shown in FIG. 1 mounted in a wall recess.

Referring to FIG. 7, there is shown a perspective view of the present invention rack assembly 10 shown in FIG. 1 mounted in a wall recess 64. The rack assembly 10 is mounted in the wall recess 64 by securely attaching the base assembly 14 to the wall recess 64. From this view it can be readily seen how that when the frame assembly 12 is moved onto the detachable service stand 28 of the detachable service stand assembly 16, unrestricted service access is provided to the stacked units. It should be noted that the base assembly 14 may be attached to the wall recess 64 via a number of common attachment means such as screws, bolts, and/or rivets.

With the present invention rack assembly 10 now fully described, it can thus be seen that the primary objective set forth above is efficiently attained and, since certain changes may be made in the above-described rack assembly 10 without departing from the scope of the invention, it is intended that all matter contained in the above description or shown in the accompanying drawings shall be interpreted as illustrative and not in a limiting sense.

What is claimed is:

1. A rack assembly for securely accommodating a stack of assorted electronic units therein, wherein said rack assembly allows said stacked electronic units to be extensible along a detachable service stand so as to allow unrestricted service access thereto, said rack assembly comprising:
   a frame assembly for securely accommodating a stack of assorted electronic units therein, said frame assembly having transport means attached thereto;
   a base assembly for supporting said frame assembly, said base assembly having guide means for cooperatively engaging with and guiding said transport means; and
   a service stand assembly for supporting said frame assembly, said service stand assembly having guide means for cooperatively engaging with and guiding said transport means, said service stand assembly being attachable to and detachable from said base assembly, said base assembly guide means and said service stand assembly guide means providing a continuous guide system for cooperatively engaging with and guiding said transport means when said base assembly and said service stand assembly are attached.

2. The rack assembly as defined in claim 1, further comprising at least one cable carrier for managing and supporting cables associated with said assorted electronic units while said frame assembly is guided along said continuous guide system, each said cable carrier being disposed between said frame assembly and said base assembly.

3. The rack assembly as defined in claim 2, wherein each said cable carrier is hinged so as to conform to the position of said frame assembly along said continuous guide system.

4. The rack assembly as defined in claim 1, wherein said frame assembly comprises vertical rack rails attached to horizontal base plates, and wherein said transport means are attached to said horizontal base plates.

5. The rack assembly as defined in claim 4, wherein said frame assembly further comprises horizontal braces attached to said vertical rack rails.

6. The rack assembly as defined in claim 1, wherein said transport means comprises ball bearing casters.

7. The rack assembly as defined in claim 1, wherein said transport means comprises flat rollers.

8. The rack assembly as defined in claim 1, wherein said transport means comprises notched wheels.

9. The rack assembly as defined in claim 1, wherein said base assembly comprises a base pan, and wherein said base assembly guide means are attached to said base pan.

10. The rack assembly as defined in claim 1, wherein said base assembly guide means comprises a caster track fixture for cooperatively engaging with and guiding said transport means, and hence said frame assembly.

11. The rack assembly as defined in claim 1, wherein said base assembly guide means comprises a channel for cooperatively engaging with and guiding said transport means, and hence said frame assembly.

12. The rack assembly as defined in claim 1, wherein said base assembly guide means comprises a guide rail for cooperatively engaging with and guiding said transport means, and hence said frame assembly.

13. The rack assembly as defined in claim 1, wherein said service stand assembly comprises a detachable service stand with service stand support means, and wherein said service stand assembly guide means are attached to said detachable service stand.

14. The rack assembly as defined in claim 13, wherein said service stand support means comprises at least one adjustable support leg.

15. The rack assembly as defined in claim 13, wherein said service stand support means comprises at least one fixed length support leg.

16. The rack assembly as defined in claim 1, wherein said service stand assembly guide means comprises a caster track fixture for cooperatively engaging with and guiding said transport means, and hence said frame assembly.

17. The rack assembly as defined in claim 1, wherein said service stand assembly guide means comprises a channel for cooperatively engaging with and guiding said transport means, and hence said frame assembly.

18. The rack assembly as defined in claim 1, wherein said service stand assembly guide means comprises a guide rail for cooperatively engaging with and guiding said transport means, and hence said frame assembly.

19. A rack assembly for securely accommodating a stack of assorted modular units therein, wherein said rack assembly allows said stacked modular units to be extensible along a detachable service stand so as to allow unrestricted service access thereto, said rack assembly comprising:
   a frame assembly for securely accommodating a stack of assorted modular units therein, said frame assembly having transport means attached thereto;
   a base assembly for supporting said frame assembly, said base assembly having guide means for cooperatively engaging with and guiding said transport means; and
   a service stand assembly for supporting said frame assembly, said service stand assembly having guide means for cooperatively engaging with and guiding said transport means, said service stand assembly being attachable to and detachable from said base assembly, said base assembly guide means and said service stand assembly guide means providing a continuous guide system for cooperatively engaging with and guiding said transport means when said base assembly and said service stand assembly are attached.

20. The rack assembly as defined in claim 19, further comprising at least one cable carrier for managing and supporting cables associated with said assorted modular units while said frame assembly is guided along said continuous guide system, each said cable carrier being disposed between said frame assembly and said base assembly.

* * * * *